US010312081B2

(12) United States Patent
Guiton et al.

(10) Patent No.: US 10,312,081 B2
(45) Date of Patent: Jun. 4, 2019

(54) SYNTHESIS OF METAL OXIDE SURFACES AND INTERFACES WITH CRYSTALLOGRAPHIC CONTROL USING SOLID-LIQUID-VAPOR ETCHING AND VAPOR-LIQUID-SOLID GROWTH

(71) Applicant: University of Kentucky Research Foundation, Lexington, KY (US)

(72) Inventors: Beth S. Guiton, Lexington, KY (US); Lei Yu, Lexington, KY (US)

(73) Assignee: UNIVERSITY OF KENTUCKY RESEARCH FOUNDATION, Lexington, KY (US)

( * ) Notice: Subject to any disclaimer, the term of this patent is extended or adjusted under 35 U.S.C. 154(b) by 0 days.

(21) Appl. No.: 15/370,041

(22) Filed: Dec. 6, 2016

(65) Prior Publication Data
US 2018/0019122 A1  Jan. 18, 2018

Related U.S. Application Data

(60) Provisional application No. 62/362,810, filed on Jul. 15, 2016.

(51) Int. Cl.
  *H01L 21/02* (2006.01)
  *C30B 1/00* (2006.01)
  *H01L 31/18* (2006.01)

(52) U.S. Cl.
  CPC ........ *H01L 21/02603* (2013.01); *C30B 1/00* (2013.01); *H01L 21/0242* (2013.01);
  (Continued)

(58) Field of Classification Search
  CPC ........ H01L 21/02603; H01L 21/02414; H01L 21/0243; H01L 21/02598; H01L 21/02653; H01L 21/02658; H01L 21/465; C23F 1/00
  See application file for complete search history.

(56) References Cited

U.S. PATENT DOCUMENTS 7,276,424 B2 * 10/2007  Wei .................... B82Y 30/00
                                                      257/E21.132
7,544,547 B2    6/2009  Fournel et al.
(Continued)

FOREIGN PATENT DOCUMENTS

WO   WO2013017408 A2   2/2013
WO   WO2014179340 A2   11/2014

OTHER PUBLICATIONS

Wagner, R. S., A Solid-Liquid-Vapor Etching Process, Journal of Crystal Growth, 3, 4 (1968) North-Holland Publishing Co., Amsterdam; pp. 159-161.
(Continued)

*Primary Examiner* — Duy Vu N Deo
(74) *Attorney, Agent, or Firm* — King & Schickli, PLLC

(57)  ABSTRACT

The present invention provides integrated nanostructures comprising a single-crystalline matrix of a material A containing aligned, single-crystalline nanowires of a material B, with well-defined crystallographic interfaces are disclosed. The nanocomposite is fabricated by utilizing metal nanodroplets in two subsequent catalytic steps: solid-liquid-vapor etching, followed by vapor-liquid-solid growth. The first etching step produces pores, or "negative nanowires" within a single-crystalline matrix, which share a unique crystallographic direction, and are therefore aligned with respect to one another. Further, since they are contained within a single, crystalline, matrix, their size and spacing can be controlled by their interacting strain fields, and the array is easily manipulated as a single entity—addressing a great challenge to the integration of freestanding nanowires into functional materials. In the second, growth, step, the same metal nanoparticles are used to fill the pores with single-crystalline nanowires, which similarly to the negative nanowires have unique growth directions, and well-defined sizes and spacings. The two parts of this composite behave (Continued)

synergistically, since this nanowire-filled matrix contains a dense array of well-defined crystallographic interfaces, in which both the matrix and nanowire materials convey functionality to the material. The material of either one of these components may be chosen from a vast library of any material able to form a eutectic alloy with the metal in question, including but not limited to every material thus far grown in nanowire form using the ubiquitous vapor-liquid-solid approach. This has profound implications for the fabrication of any material intended to contain a functional interface, since high interfacial areas and high quality interfacial structure should be expected. Technologies to which this simple approach could be applied include but are not limited to p-n junctions of solar cells, battery electrode arrays, multiferroic materials, and plasmonic materials.

16 Claims, 13 Drawing Sheets

(52) U.S. Cl.
CPC .... *H01L 21/0243* (2013.01); *H01L 21/02381* (2013.01); *H01L 21/02414* (2013.01); *H01L 21/02433* (2013.01); *H01L 21/02554* (2013.01); *H01L 21/02639* (2013.01); *H01L 21/02645* (2013.01); *H01L 21/02653* (2013.01); *H01L 31/18* (2013.01); *H01L 21/02521* (2013.01)

(56) References Cited

U.S. PATENT DOCUMENTS

| | | | |
|---|---|---|---|
| 7,662,300 | B1 | 2/2010 | Cho et al. |
| 7,727,855 | B2 | 6/2010 | Wei |
| 7,785,415 | B2 | 8/2010 | Lin et al. |
| 8,143,144 | B2 | 3/2012 | Kawashima et al. |
| 8,273,591 | B2 | 9/2012 | Hovel et al. |
| 8,389,387 | B2 | 3/2013 | Sutter et al. |
| 8,497,493 | B2 | 7/2013 | Lee |
| 8,673,750 | B2 | 3/2014 | Street et al. |
| 8,686,399 | B2 | 4/2014 | Lee |
| 8,697,548 | B2 | 4/2014 | Borowik et al. |
| 8,698,168 | B2 | 4/2014 | Ueta et al. |
| 8,810,009 | B2 | 8/2014 | Li et al. |
| 8,878,259 | B2 | 11/2014 | Hovel et al. |
| 8,890,115 | B2 * | 11/2014 | Sutter .............. B82Y 10/00 257/14 |
| 9,048,097 | B2 | 6/2015 | Warren et al. |
| 9,054,249 | B2 | 6/2015 | Chaudhari |
| 9,129,807 | B2 | 9/2015 | Qi et al. |
| 9,263,262 | B2 | 2/2016 | Auner et al. |
| 2011/0244663 | A1 | 10/2011 | Su |
| 2014/0230720 | A1 | 8/2014 | Assali et al. |
| 2015/0086871 | A1 | 3/2015 | Cao et al. |
| 2015/0279672 | A1 | 10/2015 | Hyot et al. |

OTHER PUBLICATIONS

Wagner, R. S., et al., Vapor-Liquid-Solid Mechanism of Single Crystal Growth, Applied Physics Letters, vol. 4, No. 5, (1964).

* cited by examiner

US 10,312,081 B2

SYNTHESIS OF METAL OXIDE SURFACES AND INTERFACES WITH CRYSTALLOGRAPHIC CONTROL USING SOLID-LIQUID-VAPOR ETCHING AND VAPOR-LIQUID-SOLID GROWTH

RELATED APPLICATIONS

This application claims priority to U.S. Provisional Patent Application 62/362,810, filed Jul. 15, 2016, all of which is hereby incorporated by reference in its entirety.

GOVERNMENT SUPPORT

This invention was made with government support from the National Science Foundation grant DMR-1455154. The government may have certain rights in the invention.

FIELD OF THE INVENTION

The present invention relates to a process for providing nanowires within a crystalline matrix by the steps of first etching a recession within the matrix by solid-liquid-vapor etching with a nanodroplet and subsequential nanowire growth by vapor-liquid-solid growth with the same nanodroplet.

BACKGROUND

Vapor-liquid-solid (VLS) growth and templated growth of nanowires (NWs) form two of the most widely used approaches in the synthesis of nanowires, and convey very different and valuable advantages. VLS nanowire growth produces free-standing nanowires of extremely high quality—potentially single-crystalline, defect-free, and with a single unique growth direction which may isolate anisotropic properties (Wagner et al. Journal of Applied Physics 35: 2993 (1964); Wu et al. J. Am. Chem. Soc. 123: 3165 (2001); Lu et al. Nat. Mater. 6: 8411 (2007)). The disadvantage to VLS lies in constructing useful networks or devices from such high-quality components, since aligning them or arranging them in an ordered way with respect to each other is extrememly challenging (see, Emerging Research Materials, International Technology Roadmap for Semiconductors, 2013). Growing nanowires instead using a template conversely produces well-organized components, but dispersed in an array which has material limitations; the arrays produced by templating are typically have little to no control of the crystallography of the NW-template interface, and wires which are grown in templates are often polycrystalline (Zhang et al. Chem. Mat. 11: 1659 (1999); Sauer et al. J. Appl. Phys. 91: 3243 (2002); Sander et al. Adv. Mater. 14: 665 (2002); Shingubara et al. Journal of Nanoparticle Research 5: 17 (2003)). In both of these approaches much focus has been directed towards the quality and alignment of the NW components, yet similar control of the template crystallography is not attempted, with the result that the functional potential of the template material itself, as well as the NW-template interface is largely neglected. Since the NW-template interfacial area can be vast, and since the functionality of composite materials depends critically on the nature of the interface, this represents exciting unrealized potential.

SUMMARY OF THE INVENTION

The present invention provides a method for synthesizing a nanocomposite of aligned nanowires within a crystalline matrix. The methods comprises the steps of depositing at least two metal nanodroplets on a surface of the crystalline matrix; etching a negative nanowire into the surface of the crystalline matrix by solid-liquid-vapor etching with the metal nanodroplets; and filling the negative nanowire by vapor-liquid-solid growth with a reactant vapor and the metal nanodroplets to form a nanowire. The method of the present invention may optionally include removing the metal nanodroplets following growth of the nanowire.

The method may be performed with varying materials. For example, the metal nanodroplets utilized may be comprised of any metal. In some instances, the metal may be selected from gold, gallium, silver, copper and platinum. Similarly, the crystalline matrix material can be selected from $SnO_2$, $ZnO$, $MgO$, $Ga_2O_3$, $TiO_2$, $In_2O_3$, $Fe_2O_3$, $Fe_3O_4$, $CdO$, $\gamma\text{-}Al_2O_3$, $CaO$, $NiO$, $MnO$, $Eu_2O_3$, and $Sm_2O_3$.

The reactant vapor can be selected from known material identified as capable for growing traditional nanowires. For example, the reactant vapor may contain a group IV or group 14 element, a III-V material or a II-VI material. In some instances, the reactant vapor may be selected from $SnO_2$, $ZnO$, $MgO$, $Ga_2O_3$, $TiO_2$, $In_2O_3$, $Fe_2O_3$, $Fe_3O_4$, $CdO$, $\gamma\text{-}Al_2O_3$, $CaO$, $NiO$, $MnO$, $Eu_2O_3$, and $Sm_2O_3$ and the elements of which these compounds are comprised.

The methods of the present invention also allow for varied direction of etched negative nanowire. In some instances, the etched negative nanowire may be etched vertically with respect to the surface of the crystalline matrix. In other embodiments, the etched negative nanowire may be etched horizontally along the surface of the crystalline matrix. In further embodiments, the etched negative nanowire is etched at an angle with respect to the surface of the crystalline matrix.

The methods of the present invention allow for controlled nanowire growth within and beyond the etched negative nanowire. In some embodiments growth of the nanowire may continue such that the resulting nanowire protrudes above the surface of the crystalline matrix. In other embodiments, growth of the nanowire may be discontinued such that the nanowire only partially fills the negative nanowire.

DETAILED DESCRIPTION

Figure 1:
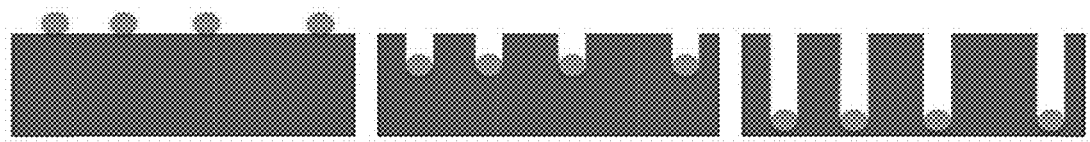
FIG. 1 shows an overview of the integrated SLV-VLS mechanisms
Figure 1:
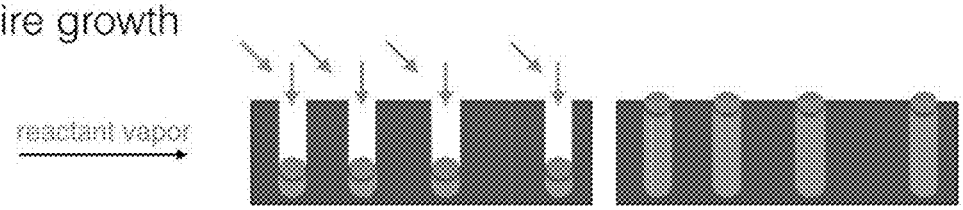

The present invention provides a method for introducing a nanowire within a crystalline substrate. The method comprises etching into a top surface of a crystalline substrate with a nanodroplet or multiple nanodroplets by solid-liquid-vapor (SLV) etching and then further using the nanodroplet (s) within the resulting etched surface to fill the etched space by vapor-liquid-solid (VLS) growth. Growth may partially fill, completely fill or exceed beyond the etched space, such that a nanowire protrudes vertically from the surface of the substrate. The present invention combines solid-liquid-vapor (SLV) etching to form a nanowire (NW) template within a crystalline substrate, with VLS growth to fill the template, such that both parts of the composite may have the high quality usually associated with VLS growth, and the high-degree of organization afforded by templating. The combined approach offered by the present invention is significant because in combining SLV and VLS, control of the NW-template interface is achieved for the first time, essentially providing for "synthesizing" interfaces with specific chemistry, crystallography, and spacing.

VLS growth revolutionized the field of NW synthesis to the point that since its implementation in 1997 there was such a burgeoning of this field that today there now exists well over 26,000 such publications on NWs. In stark contrast however, very few have attempted combining VLS growth with any templating method (Westwater et al. Jpn. J. Appl. Phys. Part 1—Regul. Pap. Short Notes Rev. Pap. 36: 6204 (1997); Lew et al. J. Cryst. Growth 254: 14 (2003); Wang et al. Nano Lett. 4: 423 (2004); Fan et al. J. Cryst. Growth 287: 34 (2006)). While these few attempts at templating VLS NWs offer some control over their placement and alignment, the lack of crystallographic control of the template pores and their interfaces with the NWs severely limits the ability to fully exploit the underlying solid state chemistry in the synthetic processes. The present invention is fundamentally different from previous templating work, in that using the SLV mechanism in the creation of the template conveys the same exact advantages to the template that the VLS-mechanism does to NW growth—namely, the ability to create well-defined defect-free pores with a single catalyst at the base of each pore such that a single NW may grow within it.

Materials

The present invention utilizes a nanodroplet or at least two nanodroplets or more on the surface of a crystalline substrate. The nanodroplet is utilized to etch into the surface of the crystalline substrate by solid-liquid-vapor (SLV) etching. The nanodroplet, then within the etched area in the crystalline substrate is utilized to catalyze NW growth and fill the etched voided area by vapor-liquid-solid (VLS) growth techniques. Those skilled in the art will appreciate that controlling the VLS reaction allows for partial filling of the etched space, complete filling of the etched space or even nanowire growth beyond the surface of the crystalline substrate.

The present invention utilizes an interface between a crystalline substrate and a nanodroplet to both allow for dissolution of the crystalline substrate to etch the negative nanowire space and to provide for controlled nanowire formation from a reactant vapor. The crystalline substrate and the reactant vapor may be selected from a group IV or group 14 element, a III-V material or a II-VI material (see, e.g., Barth et al., Progress in Materials Science 55: 563-627, 2010). The crystalline substrate or reactant may be silicon, a silicon alloy or a metal oxide. Examples of metal oxides include, but are not limited to, $SnO_2$, ZnO, MgO, $Ga_2O_3$, $TiO_2$, $In_2O_3$, $Fe_2O_3$, $Fe_3O_4$, CdO, $\gamma$-$Al_2O_3$, CaO, NiO, MnO, $Eu_2O_3$, and $Sm_2O_3$.

The choice of material for the nanodroplet can be any material known to catalyze growth of the nanowire, for which the criterion is that the reactant can form a eutectic with the metal. Examples of materials suitable for a nanodroplet include gold, gallium, silver, copper and platinum.

The selected material for the nanodroplet should be compatible with the crystalline substrate selected. Examples of appropriate pairings include, but are not limited to, gold with $SnO_2$, ZnO, MgO, $Ga_2O_3$, $TiO_2$, $In_2O_3$, $Fe_2O_3$, $Fe_3O_4$, CdO, $\gamma$-$Al_2O_3$, CaO, NiO, MnO, $Eu_2O_3$, $Sm_2O_3$; copper can be paired with ZnO, Si and SiGe; and gallium can be paired with $SiO_2$, GaN, and GaAs.

SLV Etching

The present invention provides for etching the surface of a crystalline substrate to create a space for NW growth within the crystalline substrate. The process includes placing a nanodroplet on the surface of a crystalline substrate under low pressure ($\sim 10^{-5}$ Torr or less) and high temperature (e.g 900-1000° C.). The temperature selected should be bounded by the eutectic temperature of the substrate reactant/catalyst alloy as a lower bound, and the decomposition/melting/sublimation temperature of the substrate as an upper bound. The crystalline substrate then dissolves first by the solid-liquid interface and then is removed at the liquid-vapor interface.

Solid-liquid-vapor etching is a recently observed process (see, e.g., Wagner et al. J. Cryst. Growth 3 (1968); Toole et al. Appl. Phys. Lett. 93 (2008); Hui et al. Nano Lett. 15:10 (2015)). It has been previously reported that metal catalyst nanodroplets catalyze a reverse of the VLS process, dubbed solid-liquid-vapor (SLV) etching, in bulk single-crystals, in which the droplet etches a cavity or tunnel in soluble materials to form negative nanowires or whiskers. This process has been performed using gold droplets to etch negative whiskers in ZnS, CdS, GaAs, and GaP, and in a self-catalytic mechanism using Ga droplets to etch negative NWs in GaN (Babasian et al. J. Mater. Sci 15: 1619 (1980); Givargizov et al. Journal of Elec. Materi. 9: 883 (1980); Kim et al. J. Cryst. Growth 324: 119 (2011)). In all of these cases, the metal catalyst followed a single unique direction, or set of related directions through the crystal, forming negative whiskers/wires with diameters defined by the droplet diameter. At the completion of etching the catalyst resides in the depth of the pore.

Figure 2:
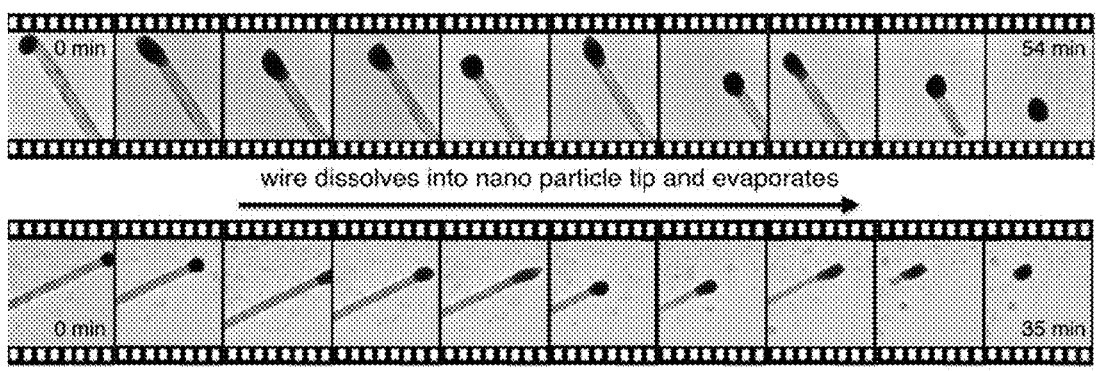
FIG. 2 shows SLV-dissolution of individual Au-tipped VLS-grown NWs during heating in situ in the TEM. Protochips E-chip substrates maintain entire sample (containing the full wire and gold particle) at a constant controlled temperature. (a) Pure $SnO_2$ NW; (b) In-doped $SnO_2$ NW.

SLV has also demonstrated dissolution of a formed nanowire, such that a catalyst will cause dissolution of a grown nanowire. FIG. 2 shows observed SLV dissolution of freestanding NWs (the process was periodically halted to collect compositional analysis data from the metal catalyst droplet). This data demonstrates the feasibility of performing SLV etching on an oxide material across a range of compositions (in this case pure- and In-doped-$SnO_2$).

VLS NW Growth

The VLS growth technique is the method of choice for the synthesis of a vast range of single-crystalline NWs, since VLS synthesis is an effective method of controlling nanowire diameter during growth, via the size of the metal catalyst particle, and results in wires with easily controlled lengths and high-crystallinity (Wu et al. J. Am. Chem. Soc. 123: 3165 (2001); Wagner et al. Appl. Phys. Lett. 4: 89 (1964); Lu et al. Appl. Phys. 39: R387 (2006)). For single elements, the growth process can be divided into three main steps: first, a precursor containing the element is cracked at the surface of a liquid catalyst droplet, usually gold, and the element is incorporated into the catalyst. In the second step, it quickly diffuses through the droplet to (what will become) the solid-liquid interface, and the droplet supersaturates (Schmidt et al. Advanced Materials 21: 2681 (2009); Schmidt et al. Chem. Rev. 110: 361 (2010)). At sufficient supersaturation, the element crystallizes out in the third step of the mechanism to form a nanowire whose diameter depends on the initial droplet size. The VLS growth system is thus governed by three critical interfaces (vapor-liquid, liquid-solid, and solid-vapor), and their specific functions may vary considerably depending on factors such as the partial pressures and chemical concentrations of the species on either side of each interface. The process is similar when it is extended to materials containing more than one element, such as the transition metal oxides, though the mechanism at each interface may increase in complexity. For example, the role of oxygen and the interface at which it is incorporated introduces an additional key variable to the process (Wang et al. Solid State Comm. 130: 89 (2004); Sun et al. J. Phys. D: Appl. Phys. 37: 409 (2004); Hseih et al. Nano Lett. 8: 3081 (2008); Lim et al. Semicond. Sci. Technol. 27: 035018 (2012)).

Figure 3:
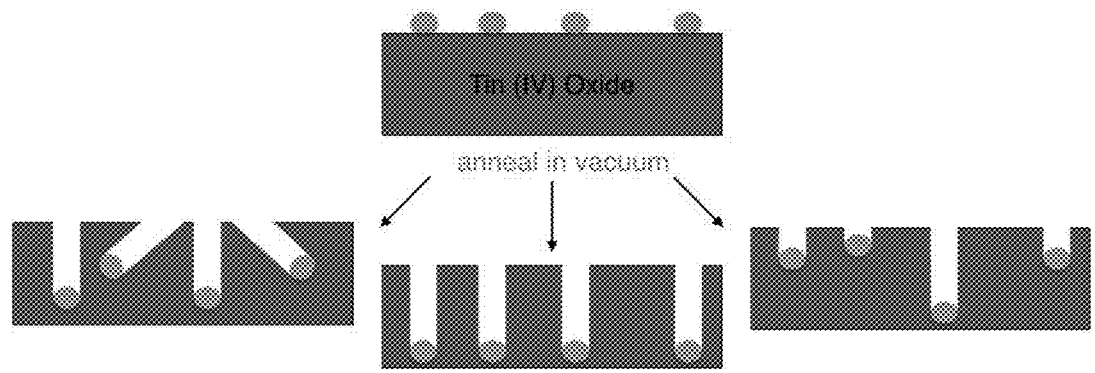
FIG. 3 shows a cartoon illustrating SLV-etching of negative NWs by Au nanodroplets into $SnO_2$. Different scenarios are depicted for which negative wire growth proceeds along equivalent but non-parallel directions (left), parallel and with equal growth rates (center), and parallel but with differing kinetics for individual wires (right).

Combined SLV and VLS Method for Negative NW Growth in Elemental and Chalcogenide Materials The present invention provides a method that combines SLV with VLS to provide NW growth within a crystalline substrate. Though the VLS mechanism is used widely to synthesize NWs from the surface of a variety of materials both simple and complex, the process has been limited to nanowires extruding from the surface. SLV etching has been demonstrated only a handful of times with the semiconducting materials ZnS, CdS, GaAs, GaP, and GaN; thus, the generalizability of negative NW growth has not yet been demonstrated (Givargizov et al. J. Cryst. Growth 37: 140 (1977); (Babasian et al. J. Mater. Sci 15: 1619 (1980); Givargizov et al. Journal of Elec. Materi. 9: 883 (1980); Kim et al. J. Cryst. Growth 324: 119 (2011)). More importantly, no one has demonstrated that metals that catalyze the VLS growth of a nanowire will also catalyze the SLV dissolution of the same material (FIG. 3). The present invention thus establishes a paradigm for translating VLS growth into SLV etching.

Figure 4:
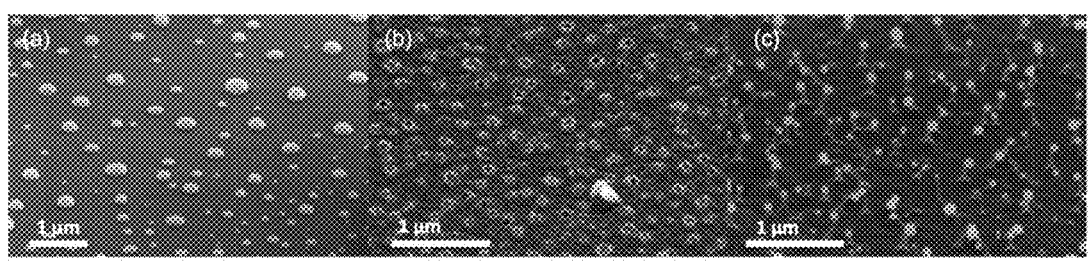
FIG. 4 shows SEM micrographs of dual SLV-etching-VLS-growth of $SnO_2/ZnO$ nanocomposites, (a) Polycrystalline thin films of $SnO_2$ (verified as phase-pure rutile by XRD) with Au nanodroplets deposited on the surface, (b) Same substrate after annealing at 700 C and $10^{-6}$ Torr, showing cavities in the film, and no visible Au droplets and (c) Au droplets have re-emerged at the tips of ZnO NWs, having catalyzed NW growth from within the $SnO_2$ etched cavities.

FIG. 4 below shows data demonstrating the successful deposition of polycrystalline $SnO_2$ thin films, and their subsequent etching by gold nanoparticles, consistent with the described methods herein. When the substrate is annealed at a temperature insufficient to SLV-dissolve $SnO_2$ NWs, the gold particles form droplets on the substrate surface, but remain static (FIG. 4, left); similar results are found when the substrate is annealed at an appropriate temperature and pressure, but with gold deposited directly onto $SiO_x$ with no $SnO_2$ film. If, however, the film is raised to similar temperatures and pressures as used in the dissolution of $SnO_2$ wires, the gold particles are no longer visible and cavities clearly form in the film (FIG. 4, center). Similar experiments on single crystals of Si, ZnO, and $SnO_2$ show successful SLV etching, and unique growth directions, again consistent with the present invention.

Although the use of templating to align NWs has been previously attempted, the functionality of these systems depends entirely on the NW components of the composite. Despite the fact that the template forms an integral part of the composite, the potential of the template and the NW-template interfaces to convey functionality to the system has never been suggested or tested. The present invention provides a way to control the crystallinity, morphology, and functionality of not only the NW components in a template system, but of the whole composite, by utilizing metal nanoparticle catalysis for the production of both constituents. The present invention, in part, has identified that a metal known to catalyze the VLS growth of nanowires of one material, and the SLV etching of pores within a second material may be used for both purposes in successive steps. Using materials known to perform each of these functions individually, the present invention provides a two-step synthesis of the composite, using the first step (SLV etching) to produce a substrate for the second step (NW growth). Direction of a VLS grown NWs from NNWs may further be changed when freestanding, driven by the interfacial energy minimization, rather than considering typically surface energy for free standing VLS grown NWs. In this way the interplay between the crystallography of freestanding NWs, negative NWs, and embedded NWs can be controlled.

Figure 5:
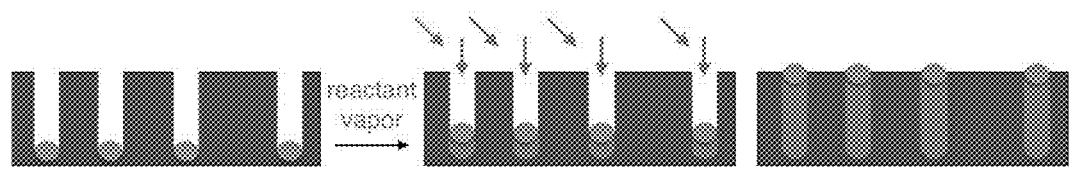
FIG. 5 shows SLV-etched $SnO_2$ template with residual Au nanodroplets is placed in the CVD furnace in the role of VLS substrate. ZnO reactant powder undergoes sublimation and the vapor is carried through the furnace where it undergoes VLS-growth of ZnO NWs, within the $SnO_2$ pores, catalyzed by the Au droplets.

In performing the present invention, first performed is SLV etching to produce porous templates with high-quality crystalline facets. As a result of this etching step, metal catalyst particles or nanodroplets reside at the bottom of each generated nanopore or etched space, similar to a traditional VLS substrate, except that the metal is embedded within the template (FIG. 5, left). In the second step we place this substrate within the CVD furnace in a typical VLS set-up, with NW starting material in the central hot region of the furnace, and the SLV-etched template downstream at a cooler position optimum for NW growth. SLV etching step may be controlled by: the position/size/shape of metal nanoparticle; temperature of furnace; pressure of the reaction chamber; reaction time; strain applied to the substrate; crystallinity and crystal orientation of substrate. SLV etching may be directed horizontally along the surface of the crystalline substrate, vertically down into the substrate or at angle between. VLS growth step may be controlled by: the depth/width/shape/spacing of "negative nanowires" during SLV; terminating crystal facets of the negative nanowires; growth temperature; growth pressure; reaction time; external applied stimuli such as electric or magnetic field; wetting of molten catalyst metal on walls of negative nanowire; and lattice matching of nanowire crystal to negative nanowire.

Those skilled in the art will appreciate that other etching approaches may be utilized as long as a nanodroplet remains at the base of the etched space. Such applicable etching substitutes include Dry Etching (Physical etching (sputter etching); chemical (plasma) etching; reactive ion etching; deep reactive ion etching), and Wet Etching.

FIG. 4 above shows data which demonstrates the viability of the present invention, using a single gold catalyst particle to first form cavities via SLV etching, and subsequently grow NWs of a second material via VLS growth. In the first step (FIG. 4, center), cavities are etched and the gold nanoparticles are not visible, residing at the bottom of a negative NW within the $SnO_2$ thin film crystalline substrate. In the second step (FIG. 4, right), the same etched substrate has been utilized as-grown, as a substrate for VLS growth of ZnO NWs. The gold particles are once again visible, having re-emerged from the $SnO_2$ film, and now reside at the tips of the ZnO NWs, which have been allowed to grow long enough to emerge clear from the substrate.

EXAMPLES

Ex. 1: Solid-Liquid-Vapor Synthesis of Negative Metal Oxide Nanowire Arrays

Single-crystalline nanowire (NW) syntheses comprise a vast body of research, in no small part because such an approach can produce materials with well-defined, crystalline surfaces which are identical in structure and function from wire to wire. (Cui et al. *Appl. Phys. Lett.* 2001, 78 (15), 2214-2216; Wang et al. *J. Am. Chem. Soc.* 2002, 124 (12), 2880-2881; Kempa et al. *J. Am. Chem. Soc.* 2013, 135 (49), 18354-18357; Cho et al. *Nano Lett.* 2014, 14 (6), 3321-3327.) In large (bulk) quantities, the large surface-to-volume ratios of nanomaterials translate to very large, functional, surface areas. For anisotropic materials such as nanowires, growing them in large arrays has created further interest, since in this architecture the surfaces presented may be aligned, and very closely spaced, making them attractive for incorporation into working devices. (Wallentin et al. *Science* 2013, 339 (6123), 1057-1060; Qiu et al. *Nanoscale* 2013, 5 (8), 3245; Jiang et al. *Angew. Chem. Int. Ed.* 2014, 53 (47), 12855-12859; Xia et al. *RSC Adv.* 2012, 2 (5), 1835.) In the usual case an array of NWs is fabricated by growing from within a (usually amorphous) template (which is subsequently dissolved), or from a patterned array of metal catalyst particles. (Kumar et al. *Dalton Trans.* 2014, 43 (15), 5713; Bograchev et al. *Electrochimica Acta* 2013, 96, 1-7; Yao et al. *Nanoscale Res. Lett.* 2015, 10 (1); Grote et al. *Appl. Phys. Lett.* 2014, 104 (5), 053904; Jafari Jam et al. *Nano Lett.* 2015, 15 (1), 134-138; Jensen et al. *Nano Lett.* 2004, 4 (10), 1961-1964.) The resulting wires are therefore freestanding, with no precise relationship to, or interaction with, one another.

An alternate approach to creating a similar array of surfaces is instead to embed an array of negative nanowires (NNWs), or pores, within a single-crystalline matrix. Several attempts have been made to create such materials with high aspect ratio pores, or NNWs, including dry etching methods, metal assisted chemical etching, and solid-liquid-vapor etching. Dry etching methods such as reactive ion etching are used widely, both industrially and for research. (Schmitt et al. *Nano Lett.* 2012, 12 (8), 4050-4054; Choi et al. *J. Am. Chem. Soc.* 2004, 126 (22), 7019-7025; Whitney et al. *Nano Lett.* 2004, 4 (8), 1507-1511; Tan et al. *J. Phys. Chem. B* 2005, 109 (22), 11100-11109.) In this approach, ions are produced from a reactive gas and accelerated with high energy, to collide and react (both physically and chemically) with a substrate. Though effective this leads to limited pore depths and correspondingly low aspect ratios, sidewall roughness induced by the ions, and can be expensive. In metal-assisted chemical etching, noble metals are used to induce local oxidation and reduction reactions under open circuit, in solution. This technique is mainly used for Si, and it remains a challenge to apply to other materials. (Brodoceanu et al. *Nanotechnology* 2016, 27 (7), 075301; Li et al. *Langmuir* 2015, 31 (44), 12291-12299; Liu et al. *Mater. Lett.* 2015, 139, 437-442; Um et al. *Sci. Rep.* 2015, 5, 11277; Yeom et al. *Adv. Funct. Mater.* 2014, 24 (1), 106-116; Li et al. *ACS Appl. Mater. Interfaces* 2014, 6 (1), 575-584; McSweeney et al. *Nano Res.* 2015, 8 (5), 1395-1442; Asoh et al. *Electrochimica Acta* 2015, 183, 8-14)

Figure 6:
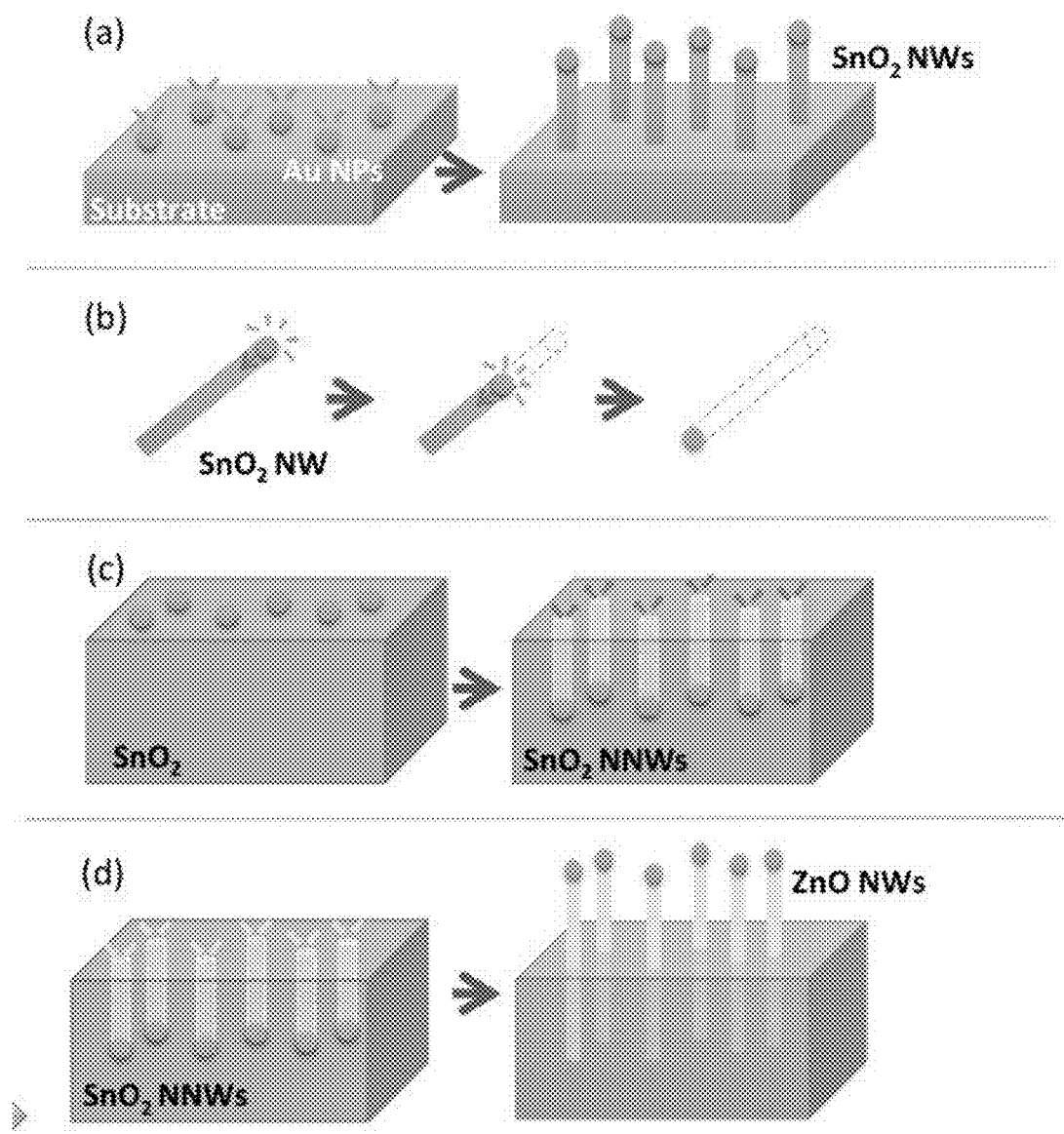
FIG. 6 shows a cartoon depicting (a) VLS growth of $SnO_2$ nanowires, (b) SLV dissolution of a single $SnO_2$ nanowire, (c) SLV creation of negative $SnO_2$ nanowires, and (d) VLS growth of ZnO nanowires from negative $SnO_2$ nanowire arrays.

One particularly elegant approach is to utilize metal catalyst droplets via the SLV mechanism. This approach employs a variation on the reverse of a typical VLS nanowire growth mechanism, in which a metal catalyst droplet catalyzes the growth of a single-crystalline NW from vapor-phase reactants (FIG. 6(*a*)). In an SLV dissolution process, diffusion from the solid into the metal suppresses the liquidus of the resulting solid solution, inducing the particle to melt. Continued diffusion into the now alloyed droplet continues, until supersaturation occurs and the reactant vapor leaves the particle at the liquid-vapor interface. If the driving forces—such as low pressure and/or a reactive chemical atmosphere—for the process are maintained, the metal droplet can be induced to etch the crystal. Schematics of this process are shown in FIG. 6(*b*) for the SLV dissolution of an entire NW, and in FIG. 6(*c*) for the SLV creation of NNW arrays as discussed herein.

In addition to the typical advantages associated with VLS nanowire growth, such as control over size of the NNW (via controlling the size of the catalyst), control of the cross-sectional shape of the NNW (by minimizing the surface energies of the bounding facets), and great versatility in the choice of material, NNW arrays created using the SLV mechanism have several other key advantages. Like free-standing NWs, NNWs could be expected to grow along unique etch directions (so as to minimize the surface energy associated with the bounding facets) and can therefore be expected to have well-defined crystallographic relationships to one another, for example by aligning in parallel. Additionally, unlike an array of freestanding NWs (other than perhaps those grown epitaxially from a single-crystalline substrate), a NNW array will not comprise many free-standing objects, but will instead be contained within a single object, rendering it facile to move and manipulate. Further, because it is contained within a single crystal, it is possible to imagine that interaction between the NNWs might be manipulated by an external stimulus, such as applied strain.

Previous work to synthesize NNW arrays has focused on Group IV, III-V, and II-VI semiconductors, and mostly utilized reactive gaseous environments. Wagner first reported SLV etching of negative whiskers in 1968, etching holes into single-crystalline Si and Ge substrates with Au and Ni catalyst particles respectively, within a reactive gas environment. (Wagner et al. *J. Cryst. Growth* 1968, 3-4, 159-161.) In this case reaction of Si or Ge with hydrogen chloride gas at the liquid-vapor interface was seen to drive the etching process. Over a decade after this first report, Givargizov et al. grew negative whiskers of ZnS via the SLV mechanism in hydrogen flow, and CdS, GaAs and GaP were found to etch in a similar way. Much more recently, InP NWs have been found to etch using Au catalyst particles in HCl flow, Ge NWs were created by etching in 2,3-butanedione, and Nikoobakht et al. found Au catalysts would etch across the (001) surface of InP, InAs, and GaP in water vapor. (Givargizov et al. *J. Cryst. Growth* 1977, 37 (2), 140-146; Babasian et al. *J. Mater. Sci.* 1980, 15 (7), 1619-1624; Givargizov et al. *J. Electron. Mater.* 1980, 9 (5), 883-904; Borgström et al. *Chem. Phys. Lett.* 2011, 502 (4-6), 222-224; Hui et al. *Nano Lett.* 2015; Nikoobakht et al. *Nano Lett.* 2015, 15 (12), 8360-8364.)

Reactive gas atmospheres can present their own challenges, however, as these gases are often corrosive, or highly diffusive, and the diffusion of reactive gases and etchant ions into the substrate material may leave behind unwanted byproducts. (Huang et al. *Adv. Mater.* 2011, 23 (2), 285-308; Geyer et al. *J. Phys. Chem. C* 2012, 116 (24), 13446-13451.) Etching in vacuum (in a non-reactive atmosphere) is a way to overcome this problem. To date, the only report of SLV etching to produce NNW arrays performed in a vacuum environment was published by Kim et al, who etched GaN self-catalytically, with Ga droplets formed by the decomposition of the surface layer of the substrate, and the only known report of SLV etching by a dissimilar catalyst material in a similar environment, involves our own work in which an entire NW of $SnO_2$ was dissolved by the metal catalyst particle at its tip (see FIG. 6(b)), during in situ heating in the transmission electron microscope (TEM). (Kim et al. *J. Cryst. Growth* 2011, 324 (1), 119-123; Hudak et al. *ACS Nano* 2014, 8 (6), 5441-5448.) On the basis of our work and the previous reports, we speculate that a similar vacuum SLV etching approach could be applied to a wide range of crystalline substrates to produce NNW arrays— indeed any catalyst-substrate material combination previously known to produce NWs via the VLS mechanism should be a viable candidate for SLV etching. Here we show controlled SLV etching in a chemical free environment using a dissimilar catalyst for the first time, on $SnO_2$, ZnO, and Si, and demonstrate control over the size, shape, and etch direction of NNW production.

Methods

Figure 10:
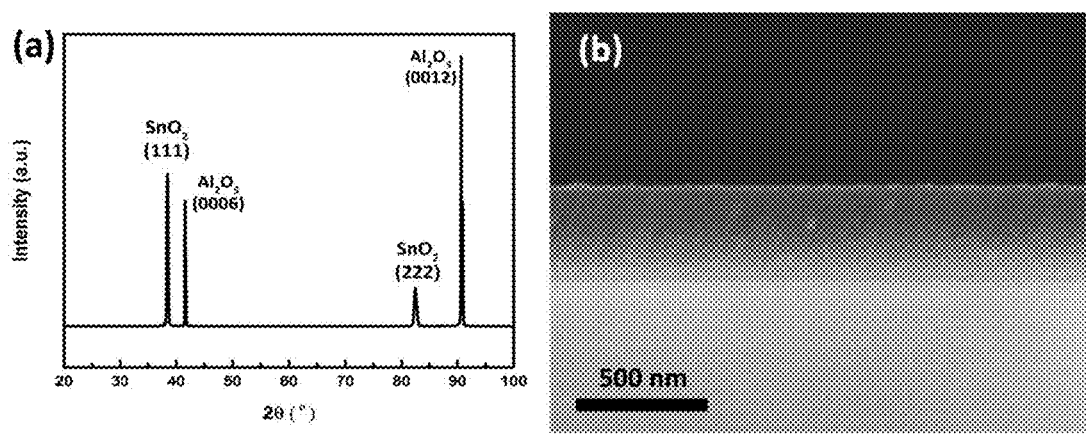
FIG. 10 shows characterization of $SnO_2$ on $Al_2O_3$ thin film. (a) XRD pattern, and (b) SEM image of the substrate cross section.

Epitaxial (111) $SnO_2$ thin-films of around 350 nm were grown on (0001) sapphire substrates via pulsed laser deposition (PLD), using a ceramic target, and a KrF excimer laser ($\lambda=248$ nm) with a fluence of 1.6 J/cm². (Tien et al. *Mater. Res. Bull.* 2009, 44 (1), 6-10.) The films were deposited at 350° C. in an oxygen atmosphere of 50 mTorr, with a laser repetition rate of 10 Hz. Commercial sapphire ($Al_2O_3$) (0001) substrates were used, bought from University Wafer. After deposition X-Ray Diffraction θ-2θ was performed and Rocking Curve measurements to verify the orientation and crystallinity. For all films used for this study, only the (111) peaks of $SnO_2$ were visible, and rates with a Full Width at Half Maximum value of 0.04, indicating these films were epitaxial and of high quality. FIG. 10 shows the x-ray diffraction pattern of $SnO_2$ thin film deposited on a sapphire substrate and corresponding SEM images of the substrate cross section.

To produce metal catalyst droplets, 4 nm (for Si) or 8 nm (for the oxides) of Au was deposited on each substrate using e-beam evaporation, and the composite was annealed at 500° C. for 30 mins, to produce NPs. Alternately 50 nm gold colloid solution (BBI Solutions) was drop-cast onto the surface.

To perform etching, the nanoparticle/substrate composite was placed in a closed end tube furnace, connected to a turbo pump and heated under the conditions given in the text at a pressure of $10^{-5}$-$10^{-6}$ Torr.

Characterization: high resolution XRD patterns were obtained on a Bruker D8 Advance x-ray diffractometer at an angle of 2θ from 20° to 100°, using Cu Kα radiation ($\lambda=0.15406$ nm). Pre-etching and post-etching substrates were imaged using a scanning electron microscope (SEM, Hitachi S 4300). Cross section of etched substrates were produced and imaged by a dual beam focused ion bean scanning electron microscope (FIB, FEI Helios Nanolab 660). A dual beam focused ion beam (FIB) scanning electron microscope (SEM) was used to view the cross section of the substrates. For this, a FEI Helios Nanolab 660 system was operated with immersion mode in either secondary electron (SE) or back-scattered electron (BSE) mode. A gas injection system (GIS) was used to deposit carbon or platinum to protect the surface of the sample, a gallium liquid metal ion source (LMIS) was used for milling, and an Oxford EDX detector was used for elemental analysis. The area for imaging was first covered in carbon or platinum and the ion beam used to drill into the sample, exposing an inner cross-section of the sample for imaging.

Results and Discussion

Figure 7:
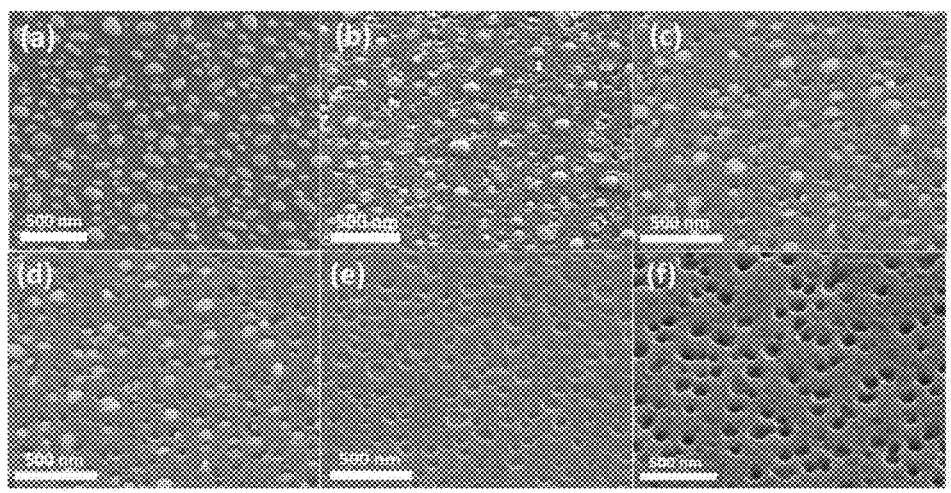
FIG. 7 shows SEM images of the SLV process. (a-c) Gold nanoparticles on SnO2 epitaxial thin-film after annealing under high vacuum at 900° C. for (a) 0 min; (b) 30 min; and (c) 60 min. (d-f); Gold nanoparticles on a SnO2 epitaxial thin-film after annealing under high vacuum for 60 min at (d) 900° C.; (e) 925° C.; and (f) 950° C.

The crystallography controlling VLS NW growth should in large part be transferable to SLV NNW array synthesis. In order to investigate the extent to which the crystallographic arguments are similar, we attempted the SLV etching process on epitaxial thin-films of $SnO_2$. 350 nm-thick films of $SnO_2$ were grown using pulsed laser deposition (PLD), and showed phase-purity and good crystallinity, with a (111) orientation due to matching with the underlying (0001) sapphire substrate (FIG. 10). Au nanoparticles (NPs) were deposited on the $SnO_2$ surface using electron-beam evaporation of a thin gold layer, and annealing. In these initial studies we first optimized the time and temperature dependence of SLV etching. In VLS NW growth, NW length is positively correlated with growth time, since the saturation of gold catalyst particle with reactants and subsequent nucleation of the NW occurs rapidly, after which the NW length increases at a roughly constant rate. (Dasgupta et al. *Adv. Mater.* 2014, 26 (14), 2137-2184; Gudiksen et al. *J. Phys. Chem. B* 2001, 105 (19), 4062-4064.) Using parameters identified previously from SLV etching of an individual NW, we annealed the $SnO_2$ film at 900° C. and low pressure for several different times, as shown in FIG. 7. (Hudak et al. *ACS Nano* 2014, 8 (6), 5441-5448) Before annealing the Au particles are easily observed on the surface of the $SnO_2$ film, and all of them have initiated the etching process after an annealing period of 60 min, though the particles are still visible (FIG. 7(c)). At the 30 min midpoint roughly half of the NPs appear to have initiated the etching process, suggesting that unlike the VLS growth process, saturation of the gold catalyst and "nucleation" of the NNW does not occur rapidly during SLV etching, most likely because the reactant is now contained within a stable crystalline lattice, as opposed to the vapor phase as is the case for VLS.

Figure 13:
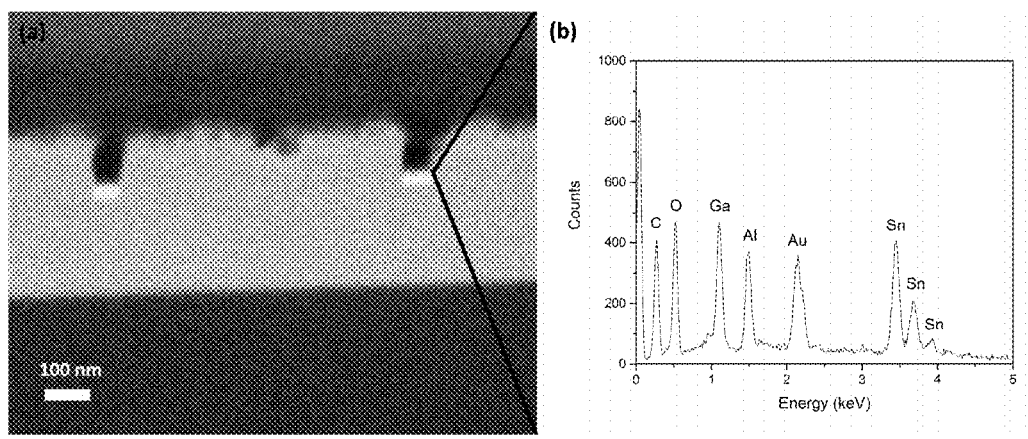
FIG. 13 shows Cross-section SEM image of $SnO_2$ thin film etched with 8 nm thickness of Au at 950° C. for 1 h (a), and EDS spectrum for the bright region at the bottom of the hole, showing the presence of gold (b).

Another key factor in determining etching depth is the annealing temperature. As shown in FIG. 7(d-f), the length of the SnO$_2$ NNWs increases with elevated annealing temperature. When annealing the Au NP-decorated SnO$_2$ substrate for one hour in vacuum, the depth of NNW is seen to increase on changing the temperature from 900° C. to 950° C. Cross-sectional images of an SnO$_2$ substrate etched at 950° C. for 60 min were collected using a dual-beam focused ion beam (FIB) instrument to mill a cross-section and image, and show the residual gold catalyst at the base of the NNW (FIG. 13). The identity of the gold was confirmed using energy dispersive X-ray spectroscopy (EDS). Studies to measure the nucleation rate, and rate of NNW growth, as a function of Au NP size, temperature, time and dispersion, are ongoing, and expected to enable quantitative modeling of the SLV-etching kinetics.

Figure 11:
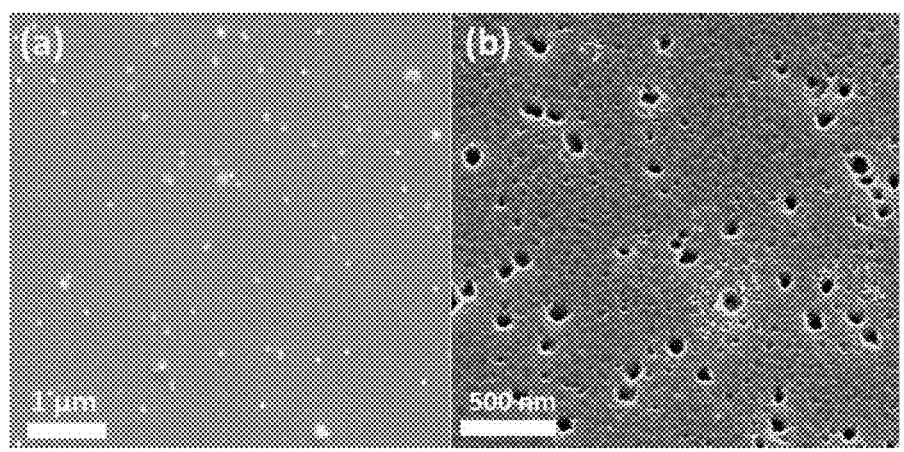
FIG. 11 shows SEM images of (1000) ZnO substrate deposited with 50 nm gold NPs. (a) Before and (b) after etching at 1000° C. for 1 h in vacuum.

One simple advantage of VLS NW growth is the ability to dictate NW diameter using the size of the metal catalyst particle. A similar dependence is observed in our experiments, as evidenced by comparison of Au NP size and dispersion before SLV etching, and NNW size and dispersion afterwards (FIG. 11). An analysis of the images shown in FIG. 11, in which 50 nm Au particles were deposited on the (0001) surface of a single-crystalline ZnO substrate, and annealed at 1000° C. for 60 mins, shows approximately a one to one correlation of the number of NPs before etching to NNWs post-etching (3.52 NPs per square micron to 3.45 NNWs per square micron respectively), and an average NNW diameter of 78+/−9.6 nm, in comparison to 50 nm for the pre-etching NPs. Interestingly, though the dispersion of NNWs, is close to the initial NPs, the average NNW diameter is seen to be consistently larger than that of the initial NP, suggesting that once melted, the NP wets the surface to form a flattened droplet with wider diameter than the initial solid metal. In the limit of a spherical NP flattening to form a completely flat disc, we calculate that the height of such a disc (assuming constant volume) would be 14 nm. An interesting observation in support of the flat disc scenario is presence of a flat disc-like piece of gold at the base of each NNW in the cross-section images shown in FIG. 13. Though potentially complex, there is clearly a close dependence of NNW diameter on initial Au droplet size, and it is the opposite to that seen for VLS growth of NWs, for which surface tension of the Au droplet leads to NW diameters smaller than the droplet diameters.

Figure 8:
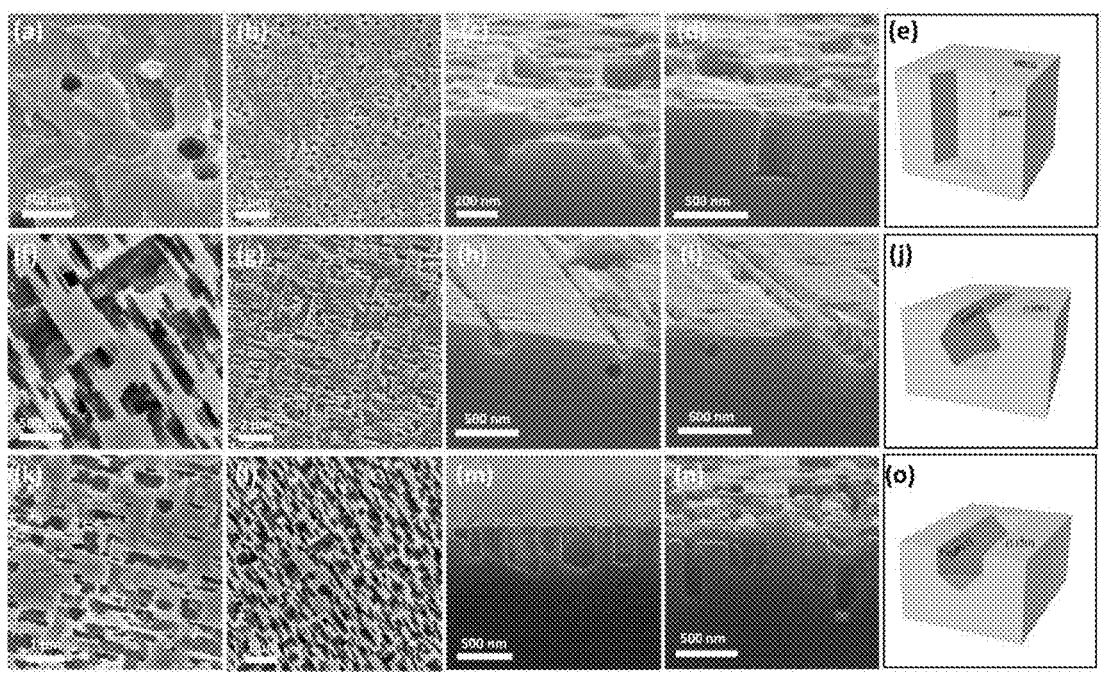
FIG. 8 shows SEM images of gold nanoparticle etched ZnO substrates with different orientations upon annealing at 1000° C. for 30 min. (a-d), (f-i) and (k-n) are SEM images of (0001), (1$\bar{1}$00) and (11$\bar{2}$0) ZnO substrates respectively, with 2 top view images and 2 cross-section view images each case. (e), (j) and (o) show cross-sectional diagrams of the expected shape of a [0001]-oriented NNW.
Figure 9:
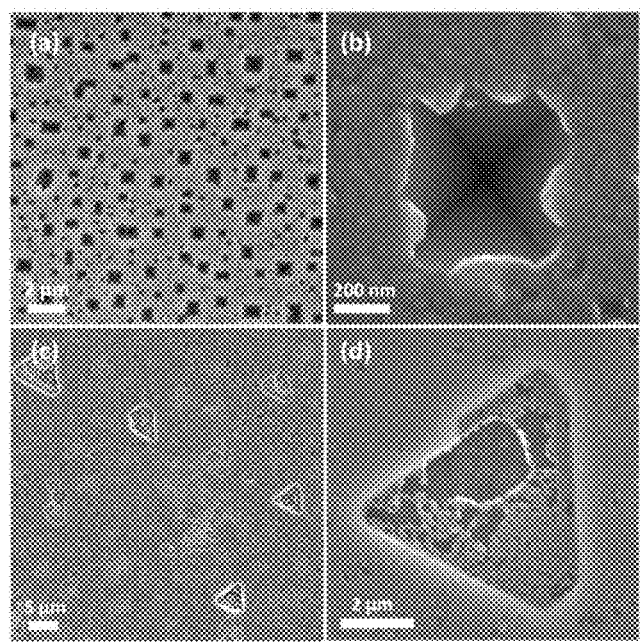
FIG. 9 shows SEM images of gold nanoparticle etched (001) Si substrate (a, b) and (111) Si substrate (c, d).

VLS grown NWs are well-known to possess unique wire directions, resulting from preferential growth directions which maximize the low energy surfaces. To investigate the possible translation of this effect to NNW growth, we performed SLV-etching of single-crystalline ZnO substrates with the wurtzite structure and three different orientations. ZnO was chosen because when grown in NW form it is consistently seen to grow along the [0001] direction, and with a distinctive hexagonal cross section. Shown in FIG. 8 are the results of SLV-etching of ZnO substrates with orientations (0001), (1$\bar{1}$00) and (11$\bar{2}$0), at 1000° C. for 30 min. Similarly to NW growth, the NNWs are seen to etch along the [0001] direction in all three cases, leading to tracks perpendicular to the substrate surface for (0001)-oriented ZnO (FIG. 8(a-d)), and parallel to the surface for (1$\bar{1}$00) and (11$\bar{2}$0) (FIG. 8(f-l, k-n)). Evidence that the NNW etch-direction is [0001] for (1$\bar{1}$00)- and (11$\bar{2}$0)-oriented ZnO is provided not only by the etch tracks parallel to the surface, but additionally by the orientation of the hexagonal cross-sections of the NNWs with respect to the surface (FIGS. 8(h, m)). These results are similar to those seen for Au NP etching of (001)-oriented InP in the presence of water vapor as the reactive gas, for which anisotropic etching occurs preferentially along the (111)-normal. (Nikoobakht et al. Nano Lett. 2015, 15 (12), 8360-8364.) Pore formation with preferred low energy facets has also been observed previously in crystals for which a simple sublimation process has occurred, with no metal catalyst particles present. (Kim et al. Phys. Rev. Lett. 2011, 107 (14), 146101.) The sublimation process will therefore present an upper temperature bound for performing SLV-etching, since maintaining catalyst control of the mechanism will require us to avoid a high-temperature sublimation regime. (Corr et al. J. Mater. Chem. 2010, 20 (8), 1413-1422.)

Figure 12:
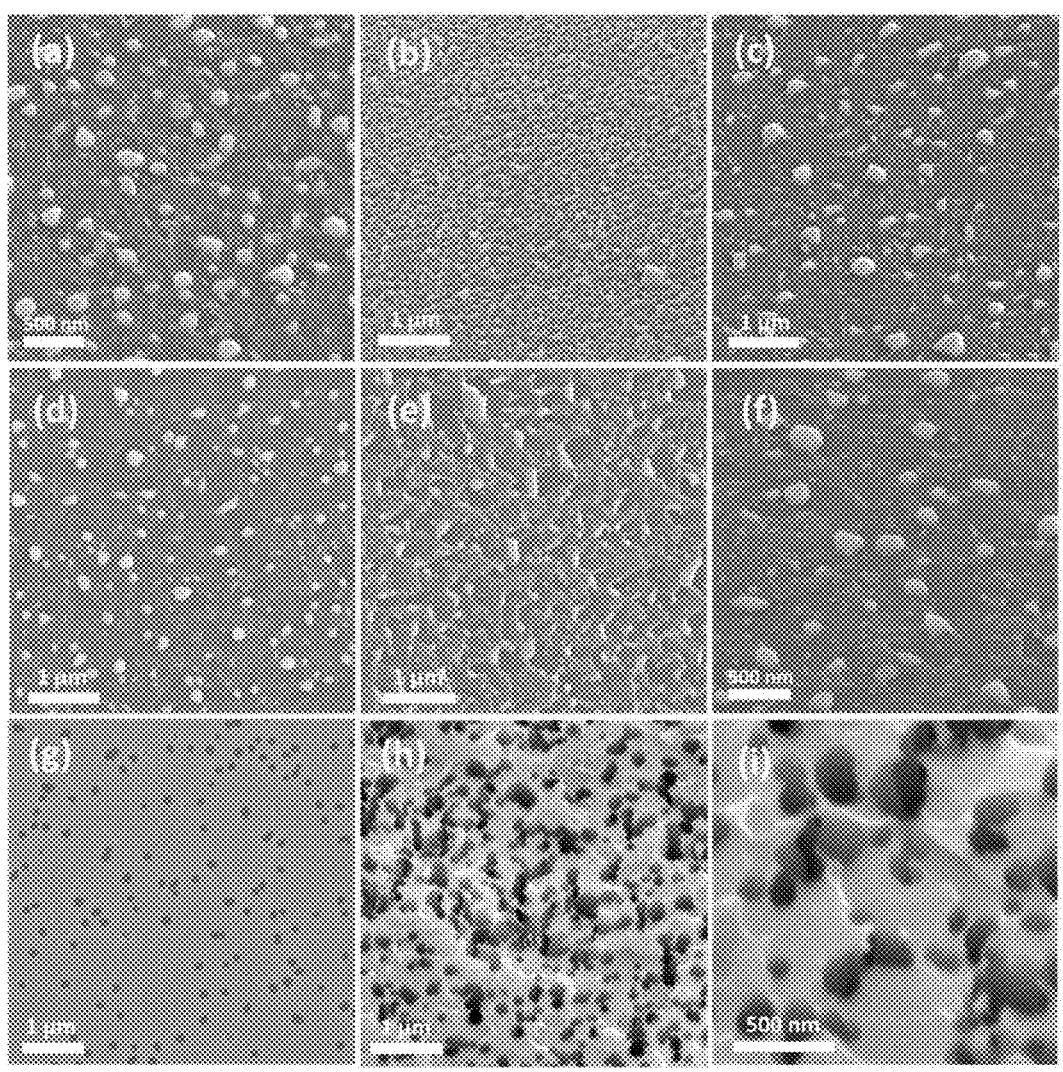
FIG. 12 shows SEM images of gold nanoparticle etched (0001) ZnO substrates upon annealing at 800° C. (a-c), 900° C. (d-f) and 1000° C. (g-i) for 1 hour in high vacuum.

Further evidence of the SLV-etching mechanism is provided by performing the process at lower temperatures. FIG. 12 shows images of (0001) ZnO substrates after etching at 800° C., 900° C. and 1000° C. for 30 min. In all three cases there is evidence of etch tracks parallel to the surface, suggesting that mobile gold droplets initially diffuse across the (0001) surface, etching trenches via the SLV process, but in the case of annealing at 1000° C. do the NPs acquire sufficient activation energy to etch perpendicular to the surface in the preferred [0001] direction. This set of observations provides evidence that though there is a thermodynamic driving force for etching in the [0001] direction, the particles must first overcome an activation energy. We speculate that this may be an adhesive force between the gold droplet and the walls of the NNW, similar to the adhesion observed between gold droplet and TEM substrate in our previous studies of individual NW dissolution via SLV. (Hudak et al. ACS nano, 2014, 8, 5441-5448)

SLV-etching was also attempted on elemental Si substrates, and did not produce NNWs for these samples, but rather etch-pits similar to those reported by other groups (Zachartatos et al. Nanotechnology 19: 405306 (2008); Oiao et al. Nano Lett. 7: 464-469 (2007); Wang et al. Nanoscale 8: 4672-4680 (2016)). Etching at 950° C. for 2 hours produced low surface energy facets in (100)- and (111)-oriented Si substrates (FIG. 5), with the crystallographically-equivalent {111} facets resulting in differently-shaped pits. For the case of (100) Si, square-pyramidal pits were formed, bounded by four {111} type planes. For the (111)-oriented Si a wide and shallow, triangular prismatic pit is formed, producing a large (111) facet at the base, with six {111}-type sidewalls. In our experiments, due to the single-crystalline nature of the underlying Si substrate, all Si pits show a clear orientation relationship to one another, aligning parallel. We include this data not as an example of NNW formation, but as an example of the orientation-relationship resulting from etching a single-crystalline substrate. The much larger footprint of these pits with respect to the original nanoparticles suggests that the gold wets the Si surface and agglomerates prior to etching. In addition to the evidence presented above, rough calculations of the expected melting and decomposition temperatures of the substrates used (provided in supporting information) reveal temperatures which are several hundred degrees higher than the temperatures used in our experiments, consistent with our assumption that in each of the examples presented, the gold catalyst droplets were responsible for etching.

CONCLUSION

This reports for the first time the SLV-based synthesis of NNW arrays in which the catalyst metal was not a product of the underlying substrate, and no reactive atmosphere was employed. Optimization of the process on epitaxial SnO2 thin-films shows that NNW growth rate can be controlled by reaction temperature, and reaction time and NP catalyst size control the length and diameter of the NNW respectively. For single-crystalline ZnO and Si substrates, a unique etch-direction was observed, leading to specific NNW or pits orientations, with respect to both the substrate surface and to one another. Given the simplicity of the SLV approach for the synthesis of NNW arrays, it should be widely generalizable to any catalyst-substrate material combination previously known to produce NWs via the VLS mechanism. As such this synthetic approach has the potential to be utilized as a method to produce high densities of highly specific and well-defined crystal facets, from a very wide range of materials, contained within in single, easy to manipulate, substrate.

The foregoing has been presented for purposes of illustration and description. It is not intended to be exhaustive or to limit the embodiments to the precise form disclosed. Obvious modifications and variations are possible in light of the above teachings. All such modifications and variations are within the scope of the appended claims when interpreted in accordance with the breadth to which they are fairly, legally and equitably entitled. All documents referenced herein including patents, patent applications and journal articles and hereby incorporated by reference in their entirety.

We claim:

1. A method for synthesizing a nanocomposite of aligned nanowires within a crystalline matrix comprising:
   (a) depositing at least two metal nanodroplets on a surface of a metal oxide single crystalline matrix;
   (b) etching negative nanowires into the surface of the crystalline matrix by solid-liquid-vapor etching with the metal nanodroplets; and
   (c) filling the negative nanowires from (b) by vapor-liquid-solid growth with a metal oxide reactant vapor and the metal nanodroplets to form nanowires within the crystalline matrix, wherein the reactant vapor is a second material to the metal oxide of the crystalline matrix.

2. The method of claim 1, further comprising removing the metal nanodroplets after step (c).

3. The method of claim 1, wherein the crystalline matrix is selected from the group consisting of $SnO_2$, ZnO, MgO, $Ga_2O_3$, $TiO_2$, $In_2O_3$, $Fe_2O_3$, $Fe_3O_4$, CdO, $\gamma$-$Al_2O_3$, CaO, NiO, MnO, $Eu_2O_3$, and $Sm_2O_3$.

4. The method of claim 1, wherein the metal nanodroplets comprise a metal selected from the group consisting of gold, gallium, silver, copper and platinum.

5. The method of claim 1, wherein the reactant vapor is selected from the group consisting of $SnO_2$, ZnO, MgO, $Ga_2O_3$, $TiO_2$, $In_2O_3$, $Fe_2O_3$, $Fe_3O_4$, CdO, $\gamma$-$Al_2O_3$, CaO, NiO, MnO, $Eu_2O_3$, $Sm_2O_3$ and elements contained therein.

6. The method of claim 1, wherein the reactant vapor comprises a group IV or group 14 element, a III-V material or a II-VI material.

7. The method of claim 1, wherein the etched negative nanowire is etched vertically with respect to the surface of the crystalline matrix.

8. The method of claim 1, wherein the etched negative nanowire is etched horizontally along the surface of the crystalline matrix.

9. The method of claim 1, wherein the etched negative nanowire is etched at an angle with respect to the surface of the crystalline matrix.

10. The method of claim 1, further comprising continuing growth of the nanowire such that it protrudes above the surface of the crystalline matrix.

11. The method of claim 1, wherein growth of the nanowire is discontinued such that the nanowire only partially fills the negative nanowire.

12. The method of claim 1, wherein the metal nanodroplets are embedded into the crystalline matrix in (b) at the base of the etched negative nanowire.

13. The method of claim 1, wherein the negative nanowire in (b) is etched to a depth to provide an adhesive force between the metal nanodroplet and walls of the negative nanowire.

14. The method of claim 1, wherein the formed nanowires are contained within the crystalline matrix.

15. The method of claim 1, wherein the formed nanowires extend beyond the surface of the crystalline matrix.

16. The method of claim 1, wherein the nanodroplets reside at the tip of the formed nanowires.

* * * * *